United States Patent
Hahn

(10) Patent No.: US 6,483,306 B2
(45) Date of Patent: Nov. 19, 2002

(54) MAGNETIC RESONANCE TOMOGRAPHY APPARATUS AND METHOD FOR GENERATING A MAGNETIC RESONANCE IMAGE OF A SUBJECT WITH DIFFERENT PULSE SEQUENCES IN K-SPACE

(75) Inventor: Rudolf Hahn, Roettenbach (DE)

(73) Assignee: Siemens Aktiengesellschaft, Munich (DE)

(*) Notice: Subject to any disclaimer, the term of this patent is extended or adjusted under 35 U.S.C. 154(b) by 0 days.

(21) Appl. No.: 09/846,902

(22) Filed: May 1, 2001

(65) Prior Publication Data

US 2001/0038284 A1 Nov. 8, 2001

(30) Foreign Application Priority Data

May 3, 2000 (DE) .......................... 100 21 496

(51) Int. Cl.⁷ ................................ G01V 3/00
(52) U.S. Cl. ........................ 324/307; 324/309
(58) Field of Search ................ 324/309, 307, 324/306, 312, 314, 300; 600/407, 411, 410

(56) References Cited

U.S. PATENT DOCUMENTS

| | | | |
|---|---|---|---|
| 5,402,067 A | * 3/1995 | Pauly et al. | 324/307 |
| 5,680,045 A | 10/1997 | Feinberg | 324/309 |
| 6,078,175 A | * 6/2000 | Foo | 324/300 |
| 6,078,176 A | 6/2000 | McKinnon | 324/309 |
| 6,198,287 B1 | 3/2001 | Heiserholt et al. | 324/322 |
| 6,201,985 B1 | * 3/2001 | Polzin et al. | 600/411 |
| 6,353,752 B1 | * 3/2002 | Madore et al. | 324/307 |

FOREIGN PATENT DOCUMENTS

DE  OS 199 01 171  7/2000

OTHER PUBLICATIONS

MR–CAT Scan: A Modular Approach for Hybrid Imaging, Hillenbrand et al., ESMRMB'99, No. 261.
MR–CAT Scan: Cardiac Imaging With A New Hybrid Approach, Jakob et al. ISMRM 1999, No. 1306.

* cited by examiner

Primary Examiner—Louis Arana
(74) Attorney, Agent, or Firm—Schiff Hardin & Waite

(57) ABSTRACT

In a magnetic resonance tomography apparatus and a method for generating a magnetic resonance image of a subject, at least one first pulse sequence and a second pulse sequence are used for scanning k-space, with the first pulse sequence and the second pulse sequence being different from one another. A transition area, within which the first pulse sequence is converted step-by-step into the second pulse sequence, is defined between the first pulse sequence and the second pulse sequence. This prevents strip artifacts in the reconstructed image caused by phase jumps and amplitude jumps which would otherwise arise due to the transition between the different pulse sequences.

14 Claims, 4 Drawing Sheets

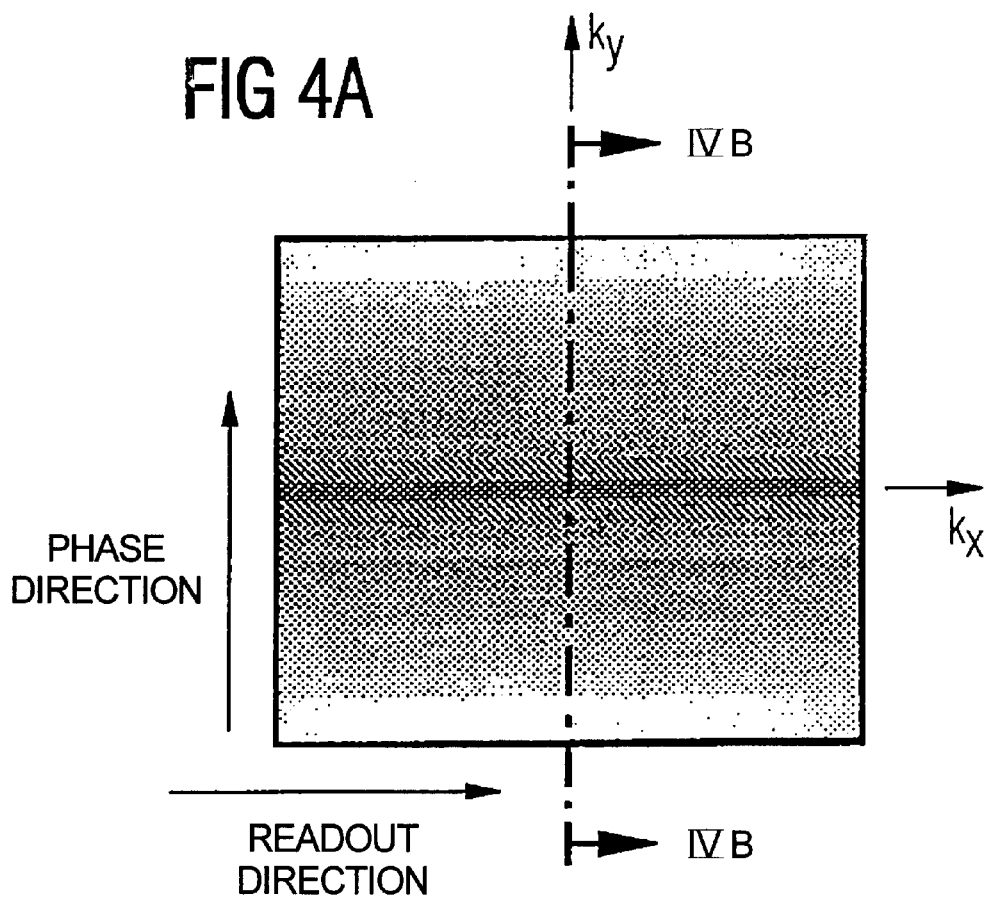
FIG 4A
FIG 4B
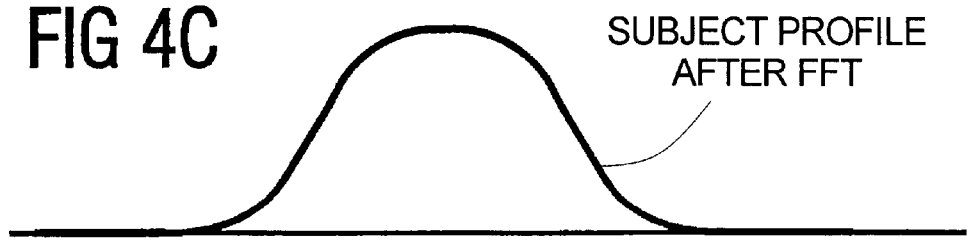
FIG 4C SUBJECT PROFILE AFTER FFT

MAGNETIC RESONANCE TOMOGRAPHY APPARATUS AND METHOD FOR GENERATING A MAGNETIC RESONANCE IMAGE OF A SUBJECT WITH DIFFERENT PULSE SEQUENCES IN K-SPACE

BACKGROUND OF THE INVENTION

1. Field of the Invention

The present invention relates to a magnetic resonance tomography apparatus and to a method for generating a magnetic resonance image of a subject, of the type wherein k-space is scanned by different pulse sequences.

2. Description of the Prior Art

In a magnetic resonance tomography apparatus for generating a magnetic resonance image of a subject, such as a slice of the human body, successive pulse sequences of one or more high-frequency pulses and one or more gradient pulses are emitted into the area of the subject to be scanned. The resulting echo signals are scanned and are used for generating a magnetic resonance image of the area. The local space, in which the subject is situated, or in which the part of the subject to be scanned is situated, is scanned in Cartesian coordinates (x, y or x, y, z) in k-space, which is a Fourier space that is inverse to the local space. The parameter k is also referred to as "normalized time" or "spatial frequency" and results from the product of the gyromagnetic relationship with the gradient field (-portion) and the time. When k-space is scanned by successive pulse sequences, the magnetization dependent on the spatial frequency k results as a measurement signal. On the basis of a fast Fourier transformation (FFT), the desired spatial distribution of the magnetization in the region to be scanned results. K-space can be two-dimensionally scanned or three-dimensionally scanned. Given a two-dimensional scanning of k-space in Cartesian coordinates, kx normally indicates the scanning direction, whereas $k_y$ refers to the phase coding direction. The basic magnetic field extends in the z-direction. Therefore, k-space is scanned by rows in the $k_x$ direction by means of a readout gradient $G_x$. Modulation of the phase coding gradient $G_y$ enables a step-by-step scanning of k-space in a row by row fashion. The sequence of the scanning of $k_x$ rows can vary dependent on the application. The middle region of k-space, i.e., the region having smaller k-values, contains the bits of information for the low spatial frequencies and therefore is controlling for the contrast of the received image. The outer regions of k-space, i.e., the larger k-values, contain the bits of information for the higher spatial frequencies and therefore determine the resolution of the received image.

In order to optimize the two opposing goals of image quality and short measuring time, different proposals have been made. One of the proposals is to utilize different pulse sequences during the scanning of k-pace. This utilization of sequences referred to as hybrid sequences includes the utilization of different pulse sequences, for example, such as FLASH pulses in the central area of k-space and EPI pulses in the outer areas of k-space, as proposed by P. M. Jacob et al. in "MR-CAT SCAN: Cardiac Imaging with a new Hybrid Approach", ISMRM 1999, No. 1306. It has also been proposed to use different pulse sequences of one single pulse sequence type, however, with different parameters, see Hillenbrand et al. in "MR CAT Scan: A Modular Approach for Hybrid Imaging", ESMRMB 1999, No. 261.

A problem during the use of different pulse sequences or heterogenous pulse sequences during the scanning of k-space is that strip artifacts caused by phase jumps and amplitude jumps occur in the reconstructed image. A cause of these artifacts can be discontinuities between scanning steps that do not immediately follow one another and between different segments in the scanning of k-space. FIGS. 3A, 3B and 3C herein show an example. FIG. 3A shows a scan in two-dimensional k-space, whereby the readout direction corresponds to the $k_x$ direction and the phase direction to the $k_y$ direction, for example. K-space is scanned by two sequences (sequence 1 and sequence 2), with sequence 1 used in the middle region and sequence 2 in the outside regions. The sectional view of FIG. 3B shows the amplitude jumps in the measuring signal given the transition between sequence 1 and sequence 2. Subsequent to the transformation of the received measuring values by means of a fast Fourier transformation in the spatial domain, these jumps lead to strip artifacts in the reconstructed image, as shown in FIG. 3C. The prior art approaches have tried to minimize the jumps occurring as a result of the use of different pulse sequences when k-space is scanned by raw data filters, such as Hanning filters. FIGS. 4A, 4B and 4C show this course of action. FIG. 4A schematically shows the application of a raw data filter to the scanning shown in the FIGS. 3A and 3B. On the basis of the applied raw data filter, the measuring values received during the scan are smoothed with respect to a continuous curve (see FIG. 4B). The Fourier transformation of the smoothed raw data results in the subject profile as shown in FIG. 4C. The disadvantages of the application of raw data filters, such as a considerable loss in image sharpness, are obvious when the FIGS. 4C and 3C are compared.

SUMMARY OF THE INVENTION

An object of the present invention therefore is to provide a magnetic resonance tomography apparatus for generating a magnetic resonance image of a subject and to provide a method for generating a magnetic resonance image of a subject, wherein an optimally efficient image quality is achieved despite the utilization of different pulse sequences when k-space is scanned.

This object is achieved in a magnetic resonance tomography apparatus having a gradient field system for generating gradient pulses, a high-frequency system for generating high-frequency pulses and for scanning echo signals, and a control apparatus for driving the gradient field system and the high-frequency system such that k-space corresponding to a region of the subject to be scanned is scanned by successive pulse sequences composed of one or more high-frequency pulses and one or more gradient pulses with at least one first pulse sequence and a second pulse sequence that is different from the first one being used, and wherein a transition area, within which the first pulse sequence is converted step-by-step into the second pulse sequence, is defined between the first pulse sequence and the second pulse sequence.

It has shown that the strip artifacts and jumps in the reconstructed image, which are caused by the utilization of different pulse sequences, can be significantly reduced or even completely prevented by such a step-by-step transition of the one pulse sequence into the other pulse sequence. It is thus possible to optimally adjust the measuring parameters desired for the generation of a magnetic resonance image, such as image quality and measuring time, in a simple way.

The first pulse sequence and the second pulse sequence preferably belong to the same pulse sequence type and in the transition area, the sequence parameters of the first pulse sequence are adapted step-by-step to the sequence parameters of the second pulse sequence. This enables an almost-continuous transition of the first pulse sequence into the second pulse sequence. The sequence parameters, which are adapted step-by-step, are one or more parameters from the parameter group of echo time, repetition time, readout bandwidth, excitation angle etc. For example, the first pulse sequence and the second pulse sequence can be spin echo sequences, with the readout bandwidth of the echo being increased and the echo time and the repetition time being reduced in the transition area from the first pulse sequence to the second pulse sequence. The excitation angle can be simultaneously reduced in the transition area.

Alternatively, the first pulse sequence and the second pulse sequence can belong to different pulse sequence types and in the transition area, the pulse sequence type of the first pulse sequence is adapted step-by-step to the pulse sequence type of the second pulse sequence. An advantage is to calculate the step-by-step transition of the fist pulse sequence into the second pulse sequence on the basis of phase values and amplitude values of the two pulse sequences.

DESCRIPTION OF THE DRAWINGS

FIG. 4A, as noted above, shows the application of a raw data filter to the scan shown in FIG. 3A.

FIG. 4B, as noted above, shows a sectional view of the representation of FIG. 4A.

FIG. 4C, as noted above, shows a representation of a subject profile of the filtered scan shown in the FIGS. 4A and 4B.

DESCRIPTION OF THE PREFERRED EMBODIMENTS

Figure 1:
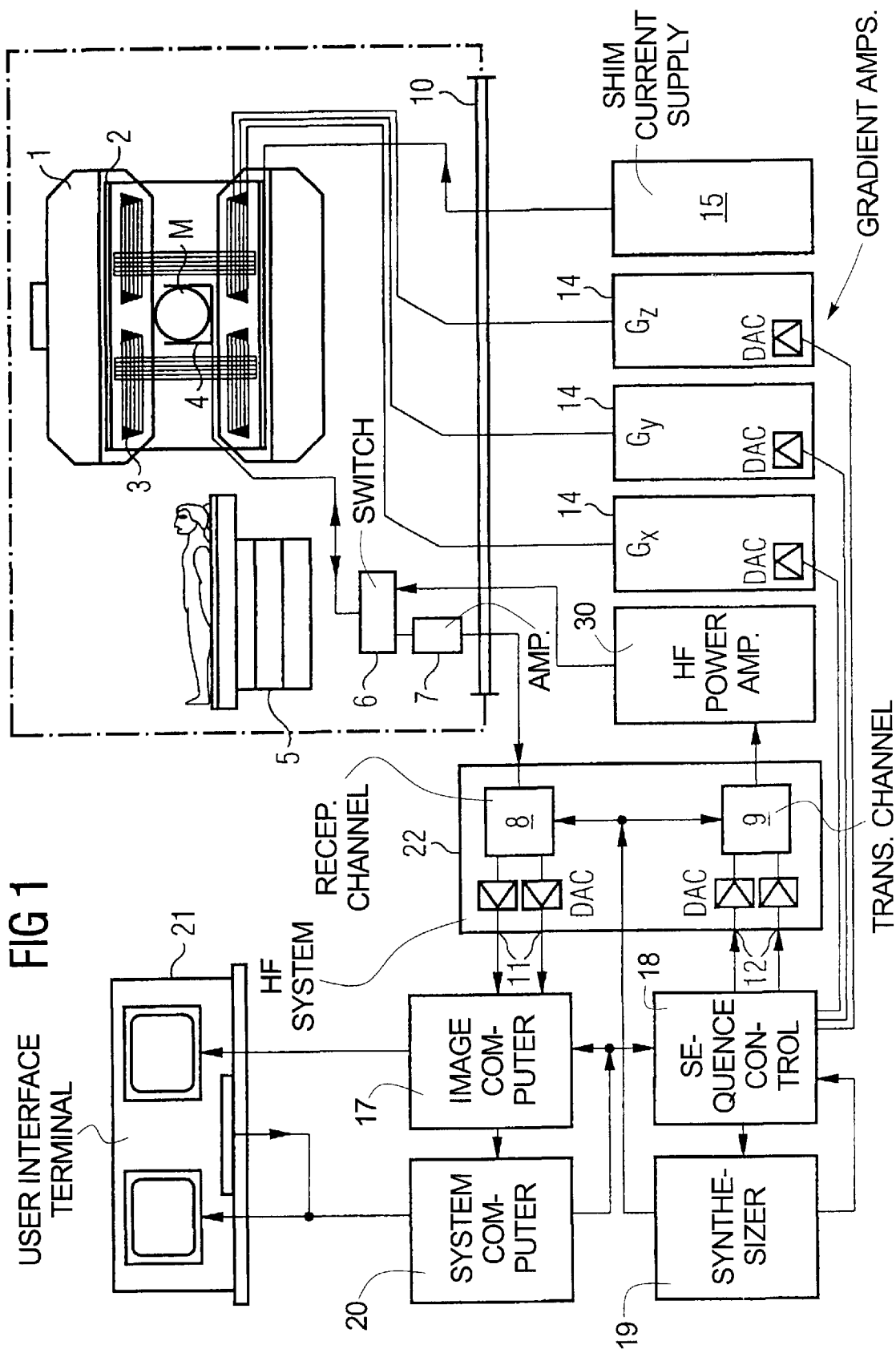
FIG. 1 is a schematic block diagram showing basic components of a magnetic resonance tomography apparatus according to the present invention.

FIG. 1 is a schematic representation of a magnetic resonance tomography apparatus for generating a magnetic resonance image of a subject according to the present invention. The structure of the magnetic resonance tomography apparatus corresponds to the structure of a conventional tomography apparatus. A basic field magnet 1 generates a chronologically constant strong magnetic field for the polarization or orientation of the nuclear spins in the examination area of a subject, such as a part of a human body to be examined. The high homogeneity of the basic magnetic field, which is necessary for obtaining magnetic resonance measurements, is defined in a spherical measuring volume M, into which a part of the human body to be examined is introduced. For supporting the homogeneity requirements and particularly for eliminating chronologically invariable influences, shim elements composed of ferromagnetic material are provided at suitable locations. Chronologically variable influences are eliminated by shim coils 2, which are driven by a shim current supply 15.

A cylindrical gradient coil system 3, which is composed of three sub-windings, is arranged in the basic magnet 1. Each sub-winding is provided with current by an amplifier 14 for generating a linear gradient field in one direction of a Cartesian coordinate system. The first sub-winding of the gradient field system 3 thereby generates a gradient $G_x$ in the x-direction, the second sub-winding generates a gradient $G_y$ in the y-direction and the third sub-winding generates a gradient $G_z$ in the z-direction. Each amplifier 14 has a digital-analog converter, which is driven by a sequence control 18 for the chronologically correct generation of gradient pulses.

A high-frequency antenna, which converts the high-frequency pulses emitted by a high-frequency power amplifier 30 into a magnetic alternating field for exciting the nuclei and orienting the nuclear spins of the subject to be examined, or the area of the subject to be examined, is situated within the grading field system 3. The alternating field produced by the precessing nuclei, i.e., normally the magnetic resonance echo signals caused by a pulse sequence composed of one or more high-frequency pulses and one or more gradient pulses, is also translated into a voltage by the high-frequency antenna 4. This voltage is supplied via an amplifier 7 to a high-frequency reception channel 8 of a high-frequency system 22. The high-frequency system 22 also has a transmission channel 9, in which the high-frequency pulses are generated for exciting the nuclear spins. The respective high-frequency pulses are digitally represented as a sequence of complex numbers in the sequence control 18 dependent on a pulse sequence prescribed by a system computer 20. This number sequence, as a real part and as an imaginary part, is supplied via an input 12 to a digital-analog converter in the high-frequency system 22 and from there is supplied to a transmission channel 9. In the transmission channel 9, the pulse sequences are modulated onto a high-frequency carrier signal, whose base frequency corresponds to the resonant frequency of the nuclear spins in the measuring volume.

The changeover from the transmitting operation to the receiving operation ensues via a transmission-reception switch 6. The high-frequency antenna 4 radiates the high-frequency pulses for exciting the magnetic resonances into the measuring volume M and receives resulting echo signals. The correspondingly acquired magnetic resonance signals are phase-dependently demodulated in the reception channel 8 of the high-frequency system 22 and are converted via a respective analog-digital converter into a real part and an imaginary part of the measuring signal. In the image computer 17, an image is reconstructed from the thus-acquired measuring data. The measuring data, image data and control programs are administered by the system computer 20. By means of control programs, the sequence control 18 controls the generation of the respectively desired pulse sequences and the corresponding scanning of k-space. The sequence control 18 particularly controls the chronologically correct switching of the gradients, the transmission of the high-frequency pulses with a defined phase and amplitude, and the reception of the magnetic resonance signals. A synthesizer 19 provides the time basis for the high-frequency system 22 and the sequence control 18. The selection of corresponding control programs for generating a magnetic resonance image and the representation of the generated magnetic resonance image ensues via a user interface terminal 21 having a keyboard and one or more screens.

The scanner components are contained in a shielded room or chamber indicated by dot-dash lines, with all connections proceeding through a feed-through panel 10.

Figure 2A:
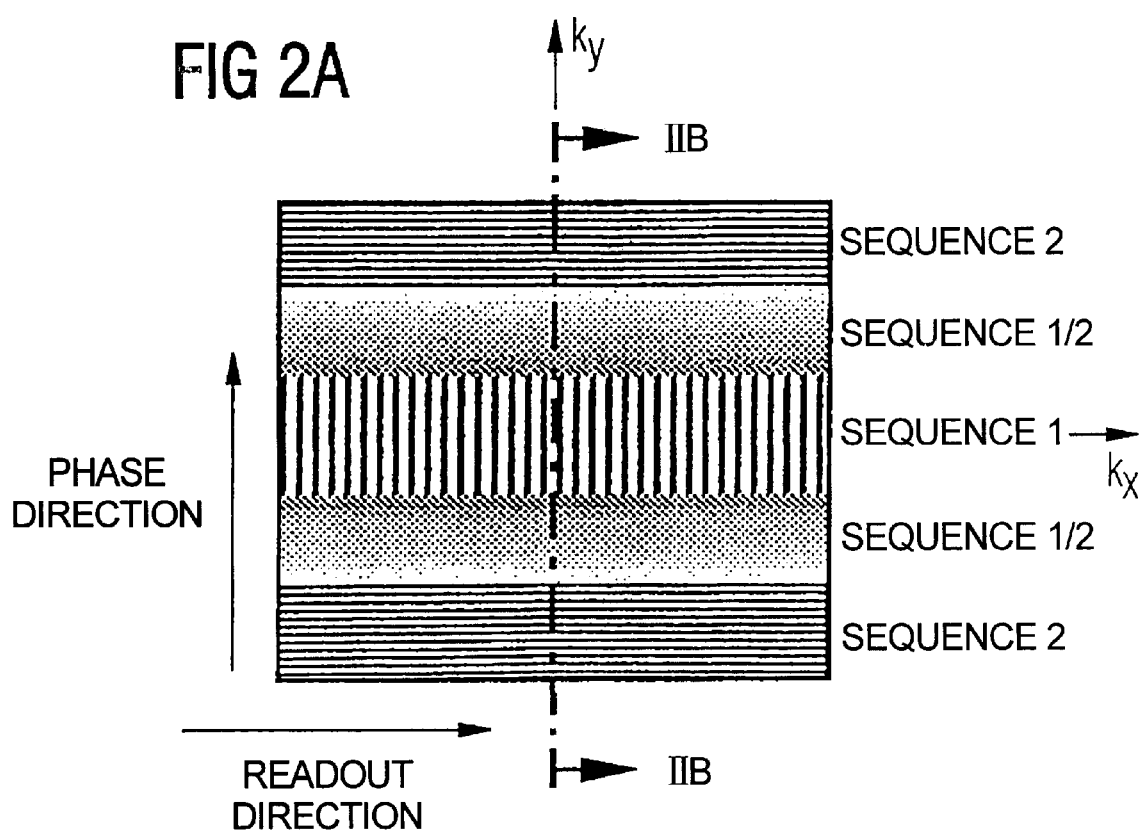
FIG. 2A shows an example of an inventive scanning of k-space.

In accordance with the invention, k-space corresponding to the area of a subject to be represented is scanned (read out) by successive pulse sequences composed of one or more gradient pulses and one or more high-frequency pulses, using at least one first pulse sequence and a second pulse sequence that is different from the first, and with a transition area, within which the first pulse sequence is converted step-by-step into the second pulse sequence, being defined in k-space between the first pulse sequence and the second pulse sequence. FIG. 2A shows an example in the scanning of two-dimensional k-space in Cartesian coordinates. The readout direction corresponds to the $k_x$-direction, for example, whereas the phase direction or phase encoding direction corresponds to the $k_y$-direction. The invention also is employable for scanning three-dimensional k-space. In the example shown in FIG. 2A, the middle area of k-space, i.e., the area of small $k_y$-values, is scanned by a first pulse sequence (sequence 1), whereas the outer areas, i.e., the areas having larger $k_y$-values, are scanned by a second pulse sequence (sequence 2). For the transition from the first pulse sequence to the second pulse sequence, the transition area (sequence 1/2) is respectively defined, in which the first pulse sequence is converted step-by-step into the second pulse sequence.

Figure 2B:
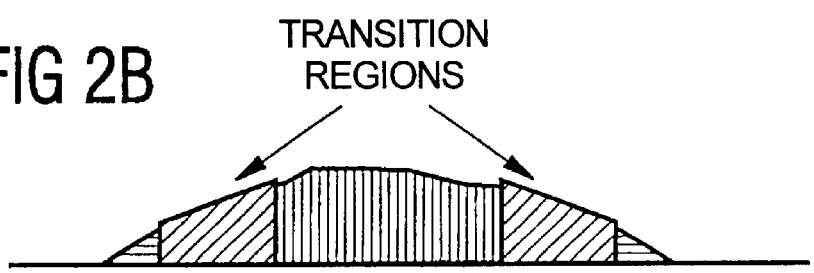
FIG. 2B shows a sectional view of the scan shown in FIG. 2A.
Figure 2C:
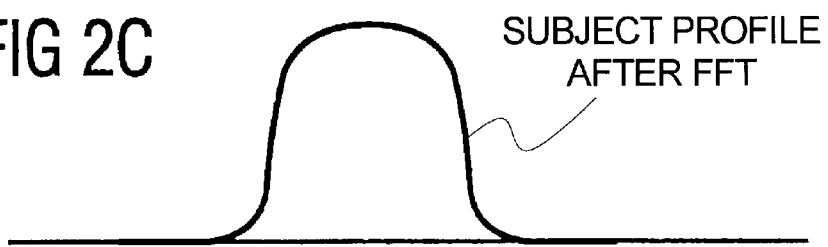
FIG. 2C shows a representation of a subject profile of the scan shown in the FIGS. 2A and 2B.
Figure 3A:
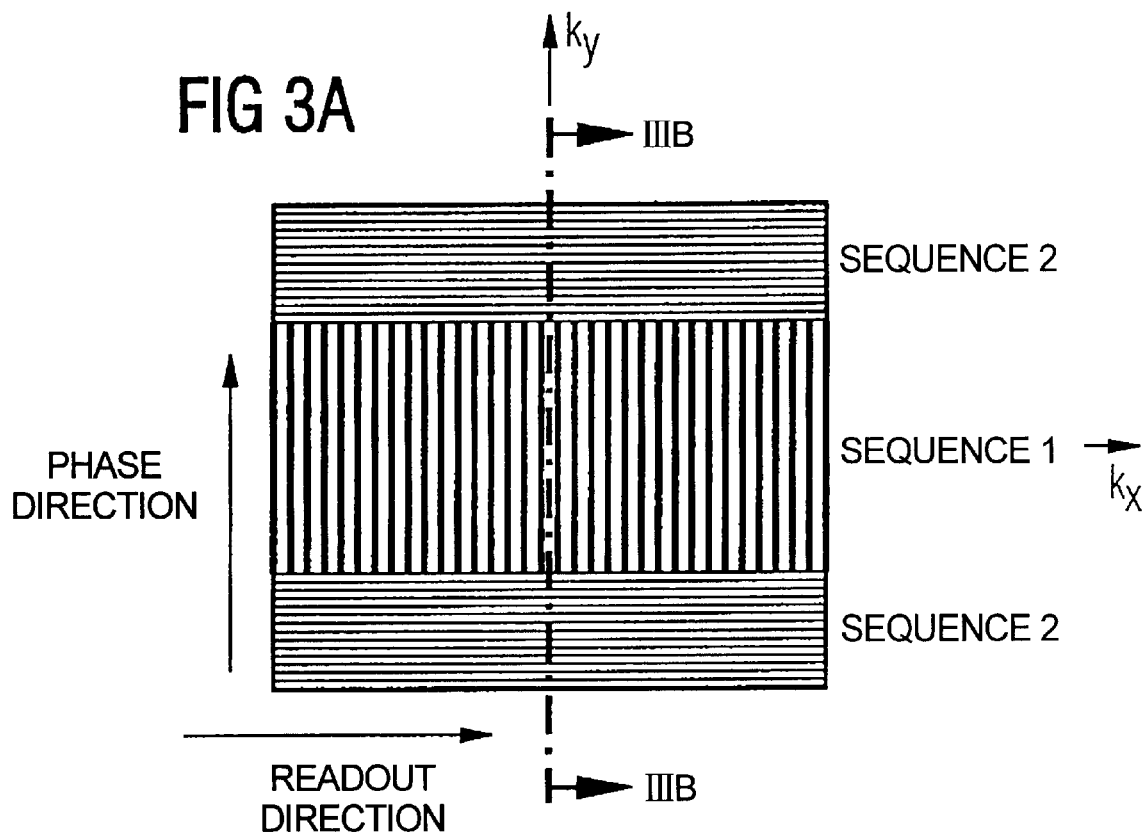
FIG. 3A, as noted above, shows a known scan of k-space.
Figure 3B:
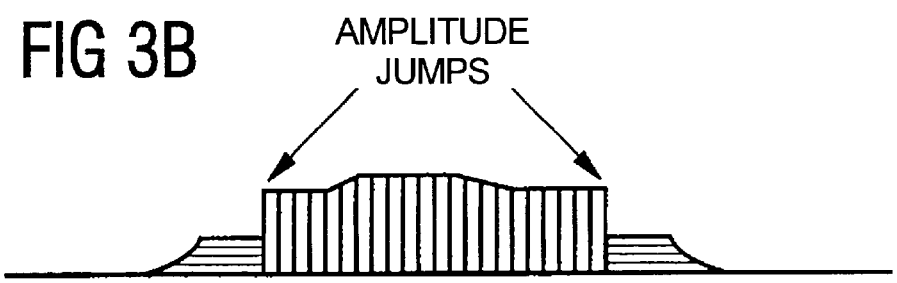
FIG. 3B, as noted above, shows a sectional view of the known scan shown in FIG. 3A.
Figure 3C:
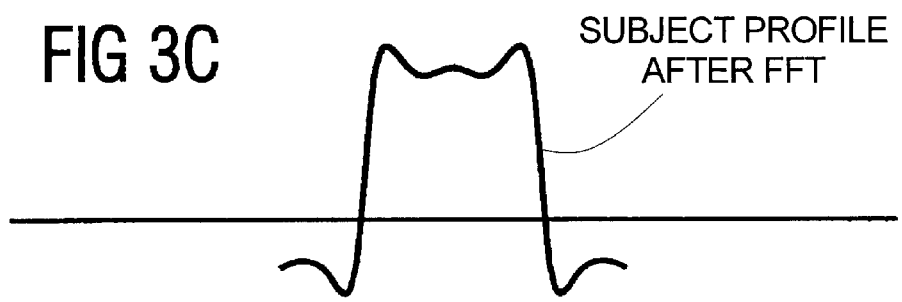
FIG. 3C, as noted above, shows a representation of a subject profile of the known scan shown in the FIGS. 3A and 3B.

FIG. 2B shows a section along the line IIA—IIA of FIG. 2A. The measuring signals, which are received by the first sequence (sequence 1) and which have smaller $k_y$-values, are represented in the middle region, whereas the outer regions show the measurement values received as a result of the scan with the second pulse sequence (sequence 2). As a result of the step-by-step transition from the first pulse sequence into the second pulse sequence, a soft and relatively smooth transition is obtained in the transition region. This results, after the subsequently carried out fast Fourier transformation, in a subject profile as shown in FIG. 2C, for example. It can be seen from FIG. 2C that—despite the difference between the pulse sequences—a sharp image that is high in contrast can be produced by the step-by-step transition between the first pulse sequence and the second pulse sequence. The transition pulse sequences used in the transition region between the first pulse sequence and the second pulse sequence are calculated in the system computer 20, which correspondingly drives the sequence control 18 of the magnetic resonance tomography apparatus of FIG. 1.

Dependent on the form of the first pulse sequence and the second pulse sequence, the pulse sequences used in the transition area are set in different ways. If the first pulse sequence and the second pulse sequence belong to the same pulse sequence type, the sequence parameters of the first pulse sequence type are adapted step-by-step to the sequence parameters of the second pulse sequence. The modified parameters that are adapted to one another can be the echo time, the repetition time, the readout bandwidth and/or the excitation angle etc., for example. The system computer 20 thereby performs a type of dissolving calculation determining the degree and the speed for the transition between the first pulse sequence and the second pulse sequence. For example, if both the first pulse sequence and also the second pulse sequence are a spin echo sequence, the readout bandwidth can be increased in the transition region from the first pulse sequence to the second pulse sequence and the echo time and repetition time can be simultaneously reduced. Furthermore, the excitation angle can also be reduced in the transition area. A complete scanning of k-space thus is achieved given a simultaneous reduction of the measuring time and maintenance of a sufficiently high image quality. In order to increase the signal-to-noise ratio, it can be started in the center of k-space ($k_y$=0) with a lower readout bandwidth than usual.

In a more general case, the first pulse sequence and the second pulse sequence belong to different pulse sequence types, and the pulse sequence type of the first pulse sequence is adapted step-by-step in the transition area. The system computer 20, in turn, carries out a type of dissolving calculation, which determines the degree and the speed of this transition. Hybrid pulse sequences simultaneously having features of the first pulse sequence type and of the second pulse sequence type can thereby arise in the transition area. Regardless of whether the first pulse sequence and the second pulse sequence belongs to the same or different pulse sequence types, the phase values and the amplitude values of the respective high-frequency pulses and gradient pulses are used as a basis for calculating the transition sequences. For example, in the center of k-space (small $k_y$-values), it can be started with a SE sequence, which accelerates in a multishot-SE-EPI pulse sequence in the outer k-space areas with an increasing EPI factor, given the utilization of different pulse sequence types. In another version, it could be started with a gradient echo sequence, which converts into a FID-EPI sequence. A reduction of the measuring time and a simultaneous maintenance of the image quality, particularly of the image sharpness, is obtained by both possibilities. Furthermore, it can be started with a TSE sequence in the center of k-space, the TSE converting into a TGSE sequence by additional gradient echoes. It can also be started with a gradient echo sequence, which successively converts into a turbo GSE sequence having an increasing echo length. A reduction in measuring time and a simultaneous maintenance of the image quality is also obtained by these two possibilities.

It should be noted that the present invention is not limited to the utilization of a first pulse sequence and a second pulse sequence with a transition region situated therebetween, but an arbitrary number of different pulse sequences can be used with transition areas situated therebetween.

Although modifications and changes may be suggested by those skilled in the art, it is in the intention of the inventor to embody within the patent warranted hereon all changes and modifications as reasonably and properly come within the scope of his contribution to the art.

I claims as my invention:

1. A magnetic resonance tomography apparatus for generating a magnetic resonance image of a subject, comprising:

a magnetic resonance scanner which scans a region of a subject to obtain raw measurement data representing said region of said subject, said magnetic resonance scanner including a gradient field system which generates gradient pulses and a high-frequency system which generates high-frequency pulses and which receives echo signals from which said raw measurement data are obtained;

a memory connected to said scanner in which said raw measurement data are stored organized in k-space;

a control apparatus for driving said gradient field system and said high-frequency system so that k-space is scanned by successive pulse sequences each composed of at least one gradient pulse and at least one high-frequency pulse, said successive pulse sequences including at least one first pulse sequence which scans a first portion of k-space and a second pulse sequence, which is different from said at least one first pulse sequence, and which scans a second portion of k-space; and said control apparatus defining a transition region between said at least one first pulse sequence and said second pulse sequence wherein said at least one first pulse sequence is converted step-by-step into said second pulse sequence.

2. A magnetic resonance tomography apparatus as claimed in claim 1, wherein said at least one first pulse sequence and said second pulse sequence belong to the same pulse sequence type, and wherein each of said at least one first pulse sequence and said second pulse sequence have respective sequence parameters, and wherein said control apparatus adapts the sequence parameters of said at least one first pulse sequence step-by-step in said transition region to the sequence parameters of the second pulse sequence.

3. A magnetic resonance tomography apparatus as claimed in claim 2, wherein the sequence parameters adapted step-by-step by said control apparatus in said transition region are selected from the group consisting of echo time, repetition time, readout bandwidth and excitation angle.

4. A magnetic resonance tomography apparatus as claimed in claim 3, wherein each of said at least one first pulse sequence and said second pulse sequence is a spin echo sequence, and wherein said control apparatus increases the readout bandwidth of an echo in said transition area and reduces the echo time and the repetition time.

5. A magnetic resonance tomography apparatus as claimed in claim 4, wherein said control apparatus reduces said excitation angle in said transition area.

6. A magnetic resonance tomography apparatus as claimed in claim 1, wherein said at least one first pulse sequence and said second pulse sequence belong to different pulse sequence types, and wherein a pulse sequence type of the first pulse sequence is adapted step-by-step by said control apparatus in said transition region to a pulse sequence type of the second pulse sequence.

7. A magnetic resonance tomography apparatus as claimed in claim 1, wherein said control apparatus executes the step-by-step conversion of said first pulse sequence into said second pulse sequence by calculating phase values and amplitude values of said at least one first pulse sequence and said second pulse sequence.

8. A method for generating a magnetic resonance image of a subject comprising the steps of:
generating gradient pulses;
generating high-frequency pulses;
receiving echo signals arising from an examination subject as a result of said gradient pulses and said high-frequency pulses and entering raw measurement data corresponding to said echo signals into k-space;

scanning k-space using successive pulse sequences composed of at least one gradient pulse and at least one high-frequency pulse using at least one first pulse sequence to scan a first portion of k-space and a second pulse sequence, which is different from said at least one first pulse sequence, to scan a second portion of k-space; and defining a transition region, between said at least one first pulse sequence and said second pulse sequence, when scanning k-space, and in said transition region converting said at least one first pulse sequence step-by-step into said second pulse sequence.

9. A method as claimed in claim 8, comprising employing said at least one first pulse sequence and said second pulse sequence which belong to the same pulse sequence type, and wherein each of said at least one first pulse sequence and said second pulse sequence have respective sequence parameters, and adapting the sequence parameters of said at least one first pulse sequence in said transition region step-by-step to the sequence parameters of the second pulse sequence.

10. A method as claimed in claim 9, comprising selecting the sequence parameters which are adapted step-by-step in said transition region from the group consisting of echo time, repetition time, readout bandwidth and excitation angle.

11. A method as claimed in claim 10, comprising employing a spin echo sequence as each of said at least one first pulse sequence and said second pulse sequence, and in said transition region, increasing the readout bandwidth of the echo from the first pulse sequence to the second pulse sequence, and reducing the echo time and the repetition time.

12. A method as claimed in claim 11, comprising also reducing the excitation angle in said transition region.

13. A method as claimed in claim 8, comprising employing said at least one first pulse sequence and said second pulse sequence which are of different pulse sequence types, and wherein the step of converting said at least one first pulse sequence into said second pulse sequence in said transition region comprises adapting the pulse sequence type of said at least one first pulse sequence step-by-step in said transition region to a pulse sequence type of said second pulse sequence.

14. A method as claimed in claim 8, wherein the step of converting said at least one first pulse sequence into said second pulse second pulse sequence in said transition region comprises calculating phase values and amplitude values of the respective at least one first pulse sequence and second pulse sequence.

* * * * *